(12) United States Patent
Choi et al.

(10) Patent No.: US 7,177,218 B2
(45) Date of Patent: Feb. 13, 2007

(54) DRAM DEVICE WITH A REFRESH PERIOD THAT VARIES RESPONSIVE TO A TEMPERATURE SIGNAL HAVING A HYSTERESIS CHARACTERISTIC

(75) Inventors: Jong-hyun Choi, Gyeonggi-do (KR); Beob-rae Cho, Gyeonggi-do (KR); Young-hun Seo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 67 days.

(21) Appl. No.: 11/117,159

(22) Filed: Apr. 28, 2005

(65) Prior Publication Data

US 2005/0276139 A1 Dec. 15, 2005

(30) Foreign Application Priority Data

Jun. 15, 2004 (KR) .................. 10-2004-0044116

(51) Int. Cl.
*G11C 7/04* (2006.01)
(52) U.S. Cl. ............ 365/211; 365/189.07; 365/189.09; 365/191; 365/149
(58) Field of Classification Search ................ 365/211, 365/189.07, 189.09, 191
See application file for complete search history.

(56) References Cited

U.S. PATENT DOCUMENTS 5,278,796 A  1/1994  Tillinghast et al. .......... 365/211

6,438,057 B1 * 8/2002 Ruckerbauer ............... 365/222
7,035,157 B2 * 4/2006 Chang ........................ 365/222

FOREIGN PATENT DOCUMENTS

| JP | 63-205713 | 8/1988 |
|---|---|---|
| KR | 000002015 | 1/2000 |
| KR | 1020030011395 | 2/2003 |
| KR | 10-2004-0013885 | 2/2004 |

OTHER PUBLICATIONS

Notice to Submit a Response for Korean Patent Application No. 10-2004-004416 mailed on Nov. 24, 2005.

* cited by examiner

*Primary Examiner*—Richard Elms
*Assistant Examiner*—Pho M. Luu
(74) *Attorney, Agent, or Firm*—Myers Bigel Sibley & Sajovec, PA

(57) ABSTRACT

A semiconductor device includes a DRAM and a temperature sense circuit. The DRAM has a refresh period that varies responsive to a temperature signal. The temperature sense circuit is configured to generate the temperature signal having a first binary value in response to sensing a temperature of the DRAM of at least a first temperature level, and to generate the temperature signal having a second binary value in response to sensing a temperature of the DRAM of less than a second temperature level, wherein the second temperature value is less than the first temperature value.

20 Claims, 4 Drawing Sheets

DRAM DEVICE WITH A REFRESH PERIOD THAT VARIES RESPONSIVE TO A TEMPERATURE SIGNAL HAVING A HYSTERESIS CHARACTERISTIC

RELATED APPLICATION

This application claims the priority of Korean Patent Application No. 10-2004-0044116, filed on Jun. 15, 2004, in the Korean Intellectual Property Office, the disclosure of which is incorporated herein in its entirety by reference.

FIELD OF THE INVENTION

The present invention relates to semiconductor devices, and more particularly, to dynamic random access memory (DRAM) devices with variable memory refresh rates.

BACKGROUND OF THE INVENTION

In a DRAM memory device, data in memory cells must be refreshed at least at a predetermined rate to maintain the data therein. Refreshing of the data is needed because the memory cells are formed from capacitors that leak current (i.e., lose their stored data state) over time. If the time between refreshing (hereinafter "refresh period") is shorter than needed to maintain the data, then current is unnecessarily consumed. In contrast, if the refresh period is longer than needed, then data may be lost from the memory cells. Accordingly, it is necessary to appropriately control the refresh period of the DRAM memory cells.

The rate at which data is lost from the memory cells can vary based on the temperature of the memory device. Accordingly, a memory device may vary the refresh period of the memory cells responsive to a sensed temperature of the memory device.

Figure 1:
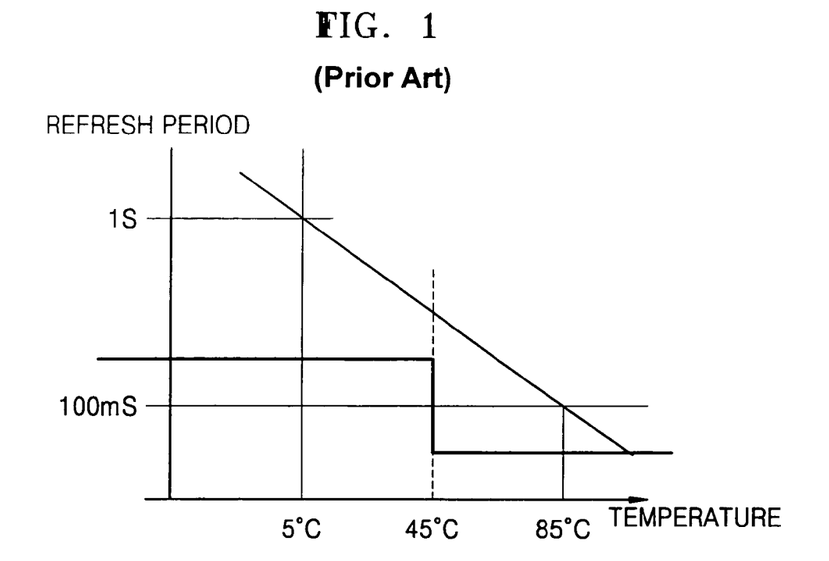
FIG. 1 is a graph that illustrates a refresh period of a DRAM that varies in a conventional manner based on temperature of the DRAM.

FIG. 1 is a graph that illustrates how a refresh period that is needed by a DRAM device can change depending upon its temperature. Referring to FIG. 1, the X-axis represents the temperature of the DRAM device and the Y-axis represents the refresh period in log scale. If the temperature of a DRAM device is about 5° C., the needed refresh period is about 1s, while if the temperature of the DRAM device is about 85° C., the needed refresh period is shortened to about 100 ms. Accordingly, the temperature of the DRAM device can be sensed, and the refresh period can be set longer when the sensed temperature of the DRAM device is low and can be set shorter when the sensed temperature of the DRAM device is high. In FIG. 1, the refresh period is set longer below 45° C. and set shorter above 45° C.

Accordingly, a temperature sensor can be used in a DRAM device to vary the refresh period and associated operations of a controller in the DRAM device, and which may reduce the current consumption of the device.

Figure 2:
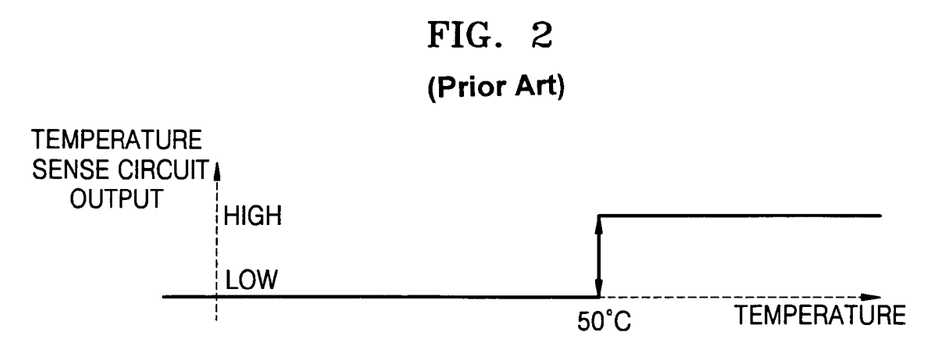
FIG. 2 is a graph that illustrates an output signal of a conventional temperature sensor.

FIG. 2 illustrates an output signal of a conventional temperature sensor based on sensed temperature. Referring to FIG. 2, when the sensed temperature increases above a predetermined temperature, the temperature sensor outputs a high binary level signal and when the sensed temperature is below the predetermined temperature, the temperature sensor outputs a low binary level signal.

If the temperature sensor changes its output signal at a 1 ms rate and senses the temperature of a device that operates around 50° C. for even a brief period, the output of the temperature sensor can alternate at a 1 ms rate between opposite binary levels (low and high). Such frequent change in the output signal binary level from the temperature sensor may cause a DRAM device, which varies its refresh rate based on the temperature signal, to erroneously change its refresh period and/or may cause other erroneous operation of the DRAM device. For example, the operational speed of the DRAM device may be reduced when a controller in the DRAM device is excessively interrupted by the frequent changes in the temperature signal.

SUMMARY OF THE INVENTION

In some embodiments of the present invention, a semiconductor device includes a DRAM and a temperature sense circuit. The DRAM has a refresh period that varies responsive to a temperature signal. The temperature sense circuit is configured to generate the temperature signal having a first binary value in response to sensing a temperature of the DRAM of at least a first temperature level, and to generate the temperature signal having a second binary value in response to sensing a temperature of the DRAM of less than a second temperature level. The second temperature value is less than the first temperature value.

In some further embodiments of the present invention, the temperature sense circuit includes first and second reference voltage generators, a comparator, and a feedback unit. The first reference voltage generator is configured to generate a first reference voltage that varies with a first slope responsive to the temperature of the DRAM. The second reference voltage generator is configured to generate a second reference voltage that varies with a second slope responsive to the temperature of the DRAM. The comparator is configured to compare the first reference voltage with the second reference voltage and to generate the temperature signal that is output by the temperature sense circuit based on the comparison. The feedback unit is configured to vary the second reference voltage generated by the second reference voltage generator based on the temperature signal from the comparator. The first slope of the first reference voltage and the second slope of the second reference voltage can be different from each other.

In still some further embodiments of the present invention, the first reference voltage generator can include an asymmetric diode structure. The second reference voltage generator can include a plurality of resistors that are configured to generate a combined resistance that varies based on one or more external control signals. The second reference voltage can then vary based on the combined resistance of the resistors.

In still some further embodiments of the present invention, the first reference voltage and the second reference voltage can be equal at a specific temperature. The second reference voltage generator can further include a plurality of switches connected across different ones of the plurality of resistors, and are configured to selectively short a corresponding one of the resistors responsive to an associated one of the external control signals and to thereby vary the resistance of the second reference voltage generator. The specific temperature at which the first reference voltage and the second reference voltage are equal can then be set to a desired sense temperature responsive to the external control signals.

In still some further embodiments of the present invention, the first reference voltage generator can include a PTAT (proportional to absolute temperature) voltage generator.

The second reference voltage generator can generate the second reference voltage having the same value as the first reference voltage at a first sense temperature when the sensed temperature of the DRAM increases, and can generate the second reference voltage having the same value as the first reference voltage at a second sense temperature when the sensed temperature of the DRAM decreases.

In still some further embodiments of the present invention, when the comparator outputs the temperature signal having the first binary value, the resistance of the second reference voltage generator increases responsive to the first binary value of the temperature signal, and when the comparator outputs the temperature signal having the second binary value, the resistance of the second reference voltage generator decreases responsive to the second binary value of the temperature signal. When the resistance of the second reference voltage generator increases, the sense temperature decreases, and when the resistance of the second voltage generator decreases, the sense temperature increases. The resistance of the second reference voltage generator can be varied by varying selected ones of the external control signals to selectively open/close corresponding ones of the switches and shorting corresponding ones of the resistors.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS OF THE INVENTION

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

The terminology used herein is for the purpose of describing particular embodiments only and is not intended to be limiting of the invention. As used herein, the term "and/or" includes any and all combinations of one or more of the associated listed items. The singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some embodiments of the present invention, a semiconductor device includes a DRAM and a temperature sensor. The temperature sensor is configured to generate a temperature signal. The DRAM includes a controller and memory cells. The controller is configured to refresh the memory cells at a refresh period that varies in response to the temperature signal.

Figure 3:
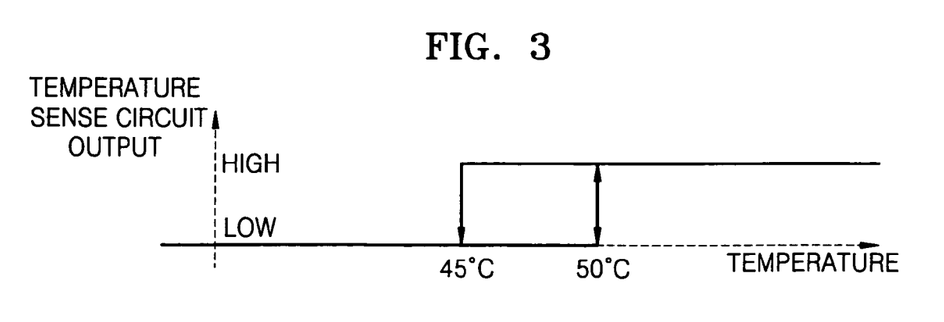
FIG. 3 is a graph that illustrates an output signal of a temperature sensor according to some embodiments of the present invention.

FIG. 3 is a graph that illustrates the temperature signal that is generated by the temperature sensor in accordance with some embodiments of the present invention. Referring to FIG. 3, the temperature sensor is configured to generate the temperature signal with a first binary value (e.g., high binary value) when a sensed temperature of the semiconductor device is at least a first temperature level (e.g., above 50° C.), and generates the temperature signal with a second binary value (e.g., low binary value) when the sensed temperature is less than a second temperature level (e.g., below 45° C.). The temperature sensor may be configured to sense the temperature of the DRAM.

The temperature sensor may be configured to generate the temperature signal with the first binary value when the sensed temperature is increasing beyond the first temperature level, and to generate it with the second binary value when the sensed temperature is decreasing below the second temperature level.

Accordingly, when the semiconductor device operates with a temperature around 50° C., once the temperature sensor outputs the temperature signal with a high binary value, the temperature signal does not change until the temperature of the semiconductor device falls below 45° C. Similarly, when the semiconductor device operates with a temperature around 45° C., once the temperature sensor outputs the temperature signal with a low binary value, the temperature signal does not change until the temperature of the semiconductor device rises above 50° C.

Accordingly, the temperature signal can have a more stable binary value when the DRAM operates around one of the temperatures thresholds that cause the temperature signal to change values. Because the temperature signal has a more stable binary value, the refresh rate of the DRAM should be more stable as it is varied based on the temperature signal. Avoiding unnecessary changes of the refresh rate of the DRAM may reduce the current consumption of the DRAM, and may allow the DRAM to operate at a higher rate than would otherwise be possible because, for example, the controller that controls operations of the DRAM is interrupted less often by the more stable temperature signal.

Although FIG. 3 illustrates an embodiment of the temperature sensor where the logic value of the temperature signal is high when the sensed temperature is above a first temperature level (e.g., 50° C.) and is low when the sensed temperature is below a second temperature level (e.g., 45° C.), it is to be understood that temperature sensor may instead be configured so that the temperature signal is high when the sensed temperature rises above the second temperature level and is low when the sensed temperature falls below the first temperature level.

Accordingly, the temperature sensor can exhibit a hysteresis characteristic in that the temperature signal that is output varies in response to the sensed temperature rising above and falling below different temperature levels. In some embodiments of the present invention, the temperature signal is fed-back to the temperature sensor and used to vary the temperature signal.

Figure 4:
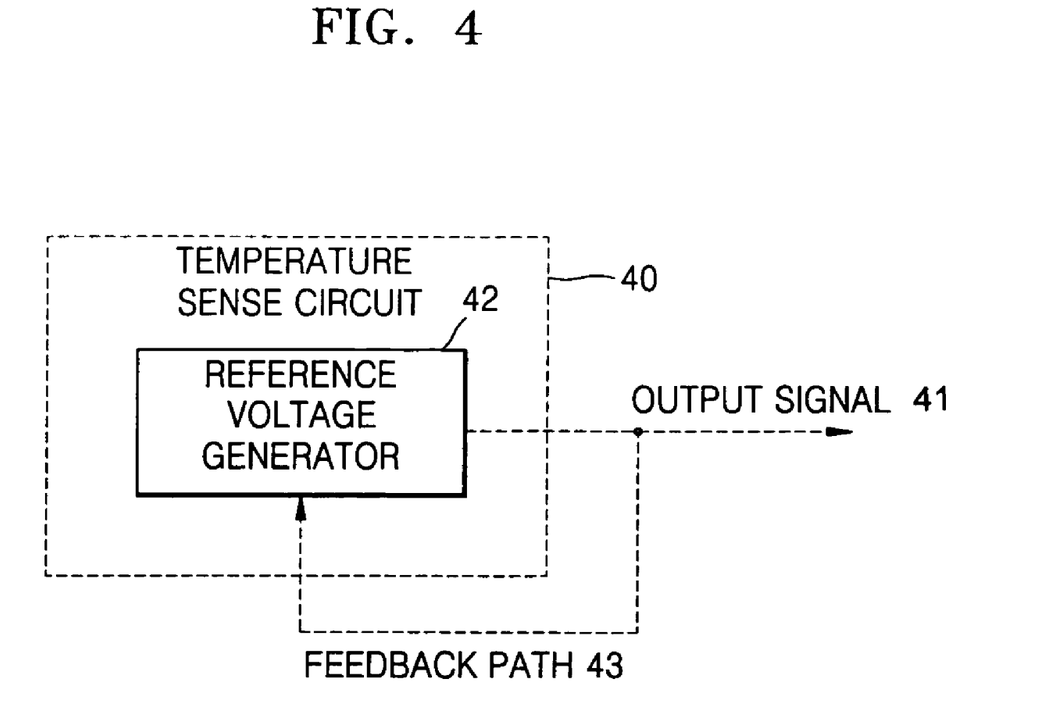
FIG. 4 is a block diagram of a temperature sensor according to some embodiments of the present invention.

FIG. 4 is a block diagram of a temperature sensor 40 according to some embodiments of the present invention. Referring to FIG. 4, the temperature sensor 40 includes a reference voltage generator 42. The temperature sensor 40 generates a temperature output signal 41 having one of two different binary levels (binary high or binary low). The temperature output signal 41 is fed-back to the reference voltage generator 42 via a feedback path 43. The reference voltage generator 42 can include a transistor in which a gate of the transistor is controlled responsive to the temperature output signal 41 from the feedback path 43, and so that the transistor can be operationally toggled on/off to provide a hysteresis effect between variation of the sensed temperature and variation of the temperature output signal 41.

The reference voltage generator 42 generates a reference voltage based on the temperature output signal 41, and which is compared by the temperature sensor circuit 40 to a sensed temperature to determine when to change the binary level of the temperature output signal 41. The reference voltage generated by the reference voltage generator 42 can be varied based on whether the temperature output signal 41 is increasing or whether it is decreasing. Varying the reference voltage in this manner can allow the temperature sensor circuit 40 to exhibit a hysteresis effect between variation of the sensed temperature and variation of the temperature output signal 41.

Figure 5:
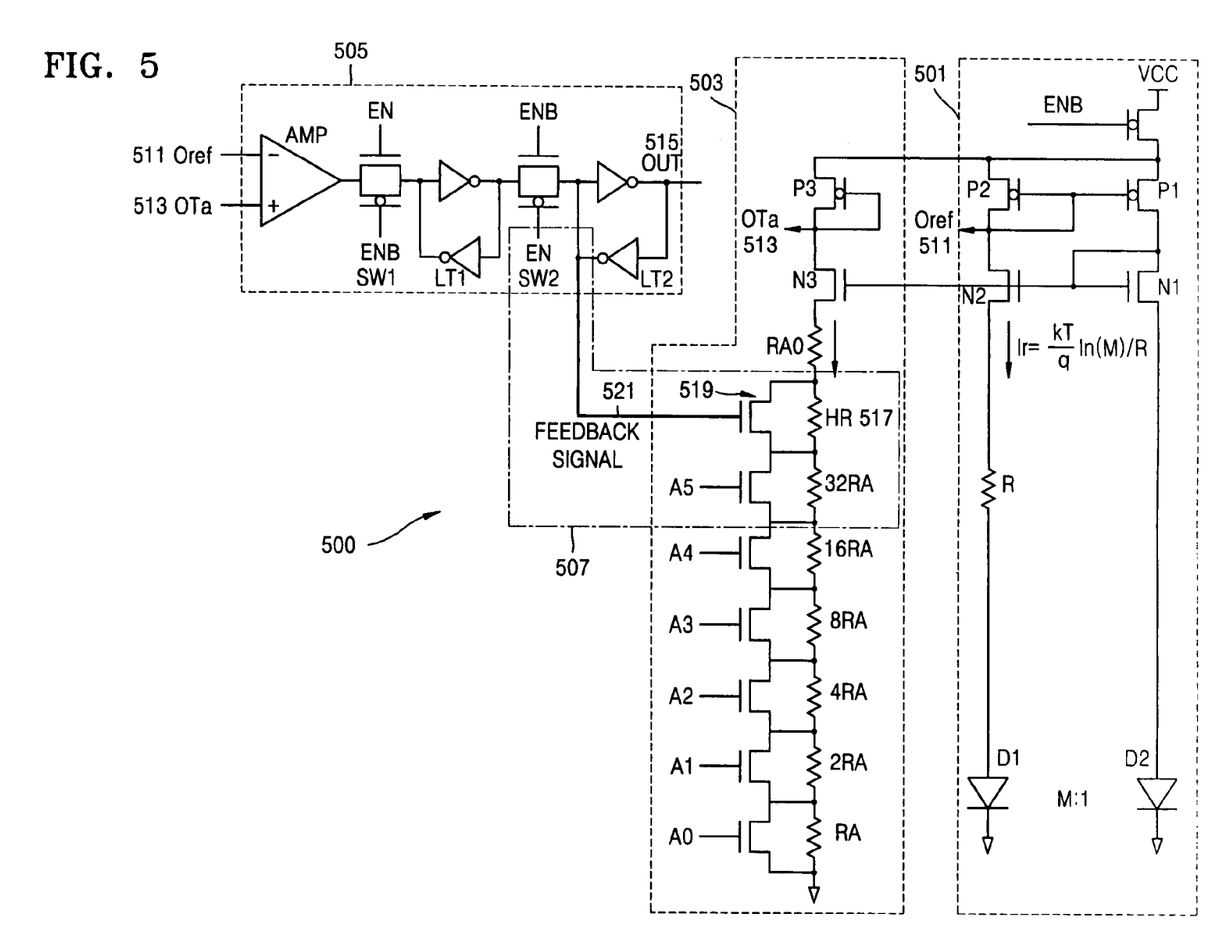
FIG. 5 is a circuit diagram of the temperature sensor of FIG. 4 according to some embodiments of the present invention.

FIG. 5 is a circuit diagram of a temperature sensor 500 that may be used in the temperature sense circuit 40 of FIG. 4 according to some embodiments of the present invention. Referring to FIG. 5, the temperature sensor 500 includes a first reference voltage generator 501, a second reference voltage generator 503, a comparator 505, and a feedback unit 507.

The first reference voltage generator 501 generates a first reference voltage (Oref; 511) that varies with a first slope in response to the temperature of the semiconductor device. The slope of the reference voltage can refer to a ratio of an amount of change in the reference voltage to an amount of change in the sensed temperature. The second reference voltage generator 503 generates a second reference voltage (OTa;513) that varies with a second slope in response to the temperature of the semiconductor device. The second slope by which the second reference voltage varies is different than the first slope by which the first reference voltage varies.

The comparator 505 receives the first reference voltage 511 from the first reference voltage generator 501 and the second reference voltage 513 from the second reference voltage generator 503, compares the magnitudes of the two reference voltages to each other and then outputs a corresponding temperature output signal (OUT; 515). For example, when the second reference voltage 513 is higher than the first reference voltage 511, the comparator 505 outputs a signal having a high binary level, and when the second reference voltage 513 is lower than the first reference voltage 511, the comparator 505 outputs a signal having a low binary level.

The feedback unit 507 transfers the output signal 515 of the comparator 505 to a switching unit 519 of a hysteresis resistor 517 in the second reference voltage generator 503. The switching unit 519 can be turned on or off in response to the binary value of the temperature output signal 515, so that the resistance of the second reference voltage generator 503 can be varied. When the branch resistance of the second reference voltage generator 503 increases, the second reference voltage increases and thus the sense temperature decreases. In contrast, when the branch resistance decreases, the second reference voltage decreases and the sense temperature increases.

With continued reference to FIG. 5, the first reference voltage generator 501 includes two PMOS transistors P1, P2, two NMOS transistors N1, N2, a resistor R, and two diodes D1, D2 that are of different sizes (e.g., different voltages). The PMOS transistor P1 and the NMOS transistor N1 form a current mirror for the PMOS transistor P2 and NMOS transistor N2. Also, the source of the PMOS transistor P2 outputs the first reference voltage 511. The source of the NMOS transistor N1 is connected to the diode D2. The source of the NMOS transistor N2 is connected to the resistor R and the diode D1 connected serially to each other. The diodes D1 and D2 can have a ratio of M:1 in their relative sizes. A current Ir flows to the NMOS transistor N2 in proportion to a temperature T and resistance R of the semiconductor device and the ratio of the relative sizes of the two diodes D1, D2. The first reference voltage 511 output from the source of the PMOS transistor P2 also is proportional to the temperature T of the semiconductor device.

The second reference voltage generator 503 includes a PMOS transistor P3, a NMOS transistor N3, a plurality of resistors RA0, HR, 32RA, 16RA, 8RA, 4RA, 2RA and RA connected serially to each other, and a plurality of NMOS transistors connected in parallel to the resistors.

The PMOS transistor P3 and NMOS transistor N3 form a current mirror for the PMOS transistor P1 and NMOS transistor N1 of the first reference voltage generator 501. The source of the PMOS transistor P3 outputs a second reference voltage 513.

A plurality of resistors are connected to the source of the NMOS transistor N3. The plurality of resistors control the second reference voltage which is output in proportion to the temperature of the semiconductor device. That is, if the total resistance of the plurality of resistors is high, the second reference voltage increases, and if the total resistance is lower, the second reference voltage accordingly decreases. Also, the transistor 519 provides resistance 517 or does not substantially provide resistance 517 in response to a signal output from the comparator 505.

The plurality of NMOS transistors in the second reference voltage generator 503 separately control the resistance of individual ones of the resistors HR, 32RA, 16RA, 8RA, 4RA, 2RA and RA, in response to corresponding ones of external control signals A0 through A5. Although the temperature sensor 500 is designed to sense a desired temperature threshold (for example, 50° C.) at which the temperature output signal is to be varied, it may be quite difficult to exactly set the temperature threshold to, for example, 50° C. during the semiconductor process steps that are used to fabricate the semiconductor device. However, by adjusting the resistance of the second reference voltage generator 503 using the external control signals A0 through A5, the temperature threshold may be calibrated more precisely to 50° C. or another desired temperature. More particularly, by turning on or off individual ones of the switches A0 through A5, individual ones of the resistors HR, 32RA, 16RA, 8RA, 4RA, 2RA and RA can be shorted, and the second reference voltage 513 can thereby be adjusted. Accordingly, the second reference voltage 513 may be used to more precisely set the temperature threshold that is used to vary the temperature output signal.

The NMOS transistor 519 connected to the hysteresis resistor HR 517 is controlled by the temperature output signal 515 from the comparator 505. More particularly, the NMOS transistor 519 is turned on when a feed back signal 521 has a high binary level, which decreases the resistance of the second reference voltage generator 502, and is turned off when the feed back signal 521 has a low binary level, which increases the resistance of the second reference voltage generator 502.

The comparator 505 includes an amplifier AMP, two switches SW1, SW2, and two latch circuits LT1, LT2. The amplifier AMP receives a first reference voltage (Oref; 511) from the first reference voltage generator 501 and a second reference voltage (OTa; 513) from the second reference voltage generator 503, and outputs a voltage with a high binary level or a voltage with a low binary level in response to the relative magnitudes of the two reference voltages. The switch SW1 and the latch circuit LT1 are provided to temporarily store data while the temperature of the semiconductor device is sensed. The switch SW2 and the latch circuit LT2 are provided to output an output signal of the comparator 505 to an external source after the temperature is sensed. More particularly, when an enable signal EN of the temperature sensor changes to a high binary level, the switch SW1 is turned on and the latch circuit LT1 latches an output signal corresponding to a sensed temperature. When the enable signal EN changes to a low binary level, the switch SW2 is turned on and the comparator 505 outputs the output signal 515 to an external source.

The output signal 521 of the switch SW2 is applied to the gate of the NMOS transistor 519 of the second reference voltage generator 503. The output signal 521 is an inverted signal of the output signal 515 of the comparator. When a signal input to the gate of the NMOS transistor 519 is an inverted signal of the output signal 515 of the comparator 505, a temperature threshold is set higher when the temperature of the semiconductor device is increasing, and is set lower when the temperature of the semiconductor device is decreasing. When the output signal 515 of the comparator 505 is input to the gate of the NMOS transistor 519, the temperature threshold is set lower when the temperature of the semiconductor device is increasing, and is set higher when the temperature of the semiconductor device is decreasing. The switches that are shown in FIG. 5 may include any type of transistor, such as, for example, NMOS type transistors or PMOS type transistors.

The operation of the temperature sensor 500 in accordance with some embodiments of the present invention will now be described with reference to FIGS. 5 and 6.

Figure 6:
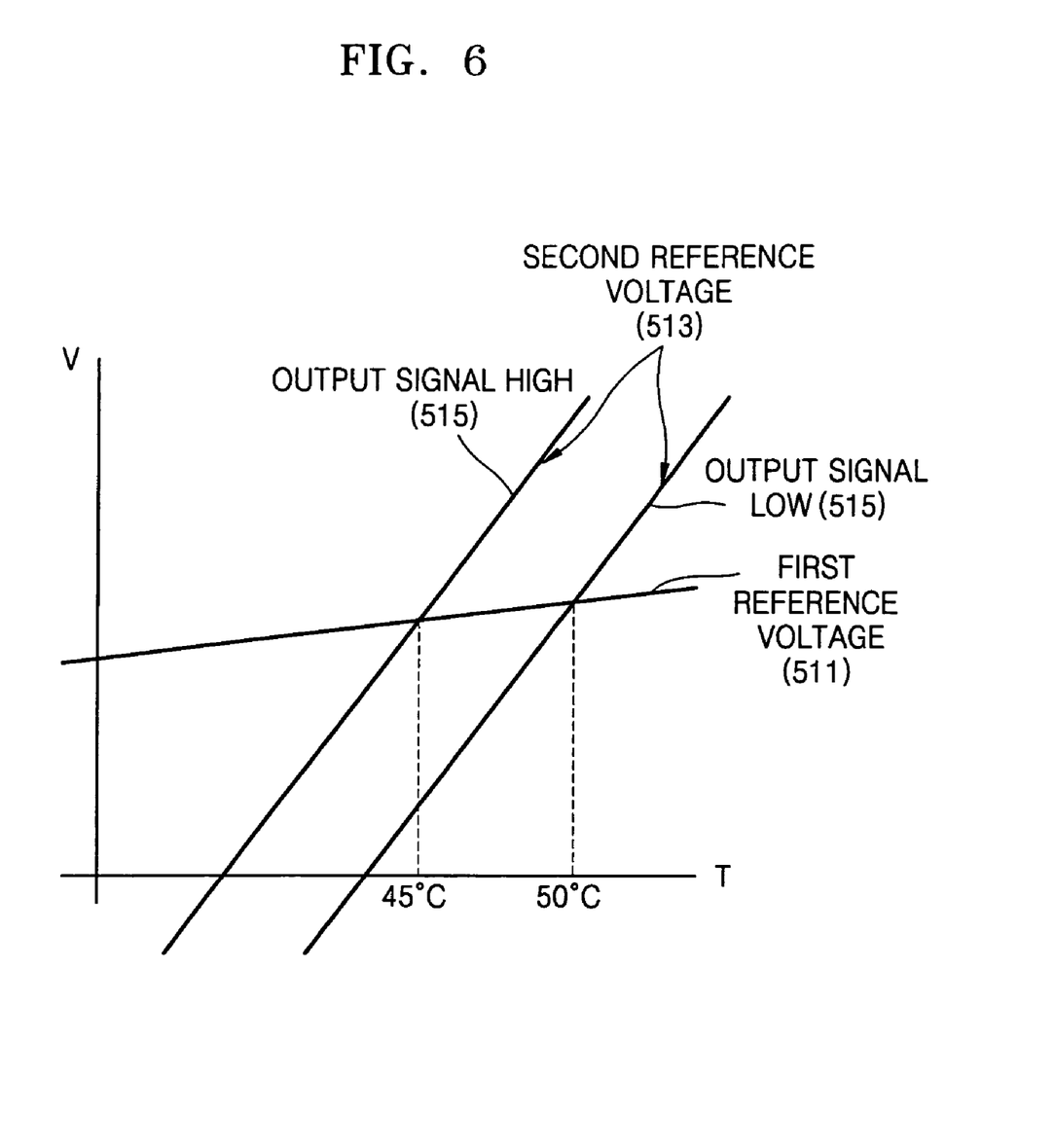
FIG. 6 is a graph that illustrates reference voltages generated by the temperature sensor shown in FIG. 5.

FIG. 6 is a graph that illustrates the reference voltages that may be generated by the temperature sensor 500 shown in FIG. 5.

Referring to FIGS. 5 and 6, the first reference voltage 511 from the first reference voltage generator 501 and the second reference voltage 513 from the second reference voltage generator 503 vary in response to temperature of the semiconductor device, but each one varies with a slope that is different than the other one. The first reference voltage 511 and the second reference voltage 513 become equal at a specific temperature, which is a sense temperature or temperature threshold. As was explained above, it may be difficult to precisely set the sense temperature to a desired temperature during the manufacturing process of the semiconductor device. However, the sense temperature can be more precisely set to a desired value by shifting the level of the first reference voltage or the second reference voltage, which may be provided by varying the combined resistance of the resistors HR517, 32RA, 16RA, 8RA, 4RA, 2RA, RA using the external control signals A0 through A5.

When the temperature of a semiconductor device is below 45° C. but increasing, the comparator 505 in the temperature sensor 500 outputs the temperature signal 515 with a low binary level (e.g., "0") because the first reference voltage 511 is higher than the second reference voltage 513. The feedback signal 521 input to the NMOS transistor 519 of the second reference voltage generator 503, which is an inverted signal of the output signal 515, has a high binary level. Accordingly, the NMOS transistor 519 is turned on, the entire resistance of the second reference voltage generator 503 decreases and thus the second reference voltage 513 decreases. Therefore, as shown in FIG. 6, the sense temperature is set to 50° C. Accordingly, the comparator 505 outputs the temperature signal 515 with a low binary level while sensing the temperature of the semiconductor device until the sensed temperature increases beyond 50° C.

Accordingly, when the semiconductor device operates around 50° C., because the sense temperature is set to 45° C., once the temperature output signal 515 changes to a high binary level (e.g., "1"), the temperature sensor 500 will not change the signal 515 back to a low binary level unless the temperature falls below 45° C. Accordingly, the temperature output signal 515 can remain with a stable high binary level while the semiconductor device operates around 50° C.

When the temperature of the semiconductor device is above 50° C., the comparator 505 will output the temperature output signal 515 with a high binary level ('1') because the second reference voltage 513 is higher than the first reference voltage 511. The feedback signal 521 input to the NMOS transistor 519 of the second reference voltage generator 503, which is an inverted signal of the output signal 515, is changed to a low binary level ('0'). Accordingly, the NMOS transistor 519 is turned off, the entire resistance of the second reference voltage generator 503 increases and thus the second reference voltage 513 increases. Therefore, as shown in FIG. 6, the sense temperature can be set to 45° C. Accordingly, the comparator 505 outputs temperature output signal 515 with a high binary level until the sensed temperature decreases below 45° C.

When the semiconductor device operates around 45° C., because the sense temperature is set to 50° C. once the output signal 513 changes to a low binary level, the temperature sensor 500 will not change the signal 515 back to a high binary level until the temperature rises above 50° C.

By adjusting the resistance of the hysteresis resistor 517 in the temperature sensor shown in FIG. 5, it is possible to allow the temperature sensor to provide a hysteresis effect with appropriate temperature intervals.

Accordingly, the temperature signal can have a more stable binary value when the semiconductor device operates near one of the temperature thresholds (sense temperatures) that cause the temperature signal from the temperature sensor to change. When a DRAM varies its refresh rate based on the temperature signal, the refresh rate of the DRAM should be more stable. Avoiding unnecessary changes of the refresh rate of the DRAM may reduce the current consumption of the DRAM, and may allow the DRAM to operate at a higher rate than would otherwise be possible because, for example, the controller that controls operations of the DRAM is interrupted less often by the more stable the temperature signal.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

What is claimed is:

1. A semiconductor device comprising:
   a DRAM having a refresh period that varies responsive to a temperature signal; and
   a temperature sense circuit that is configured to generate the temperature signal having a first binary value in response to sensing a temperature of the DRAM of at least a first temperature level, and to generate the temperature signal having a second binary value in response to sensing a temperature of the DRAM of less than a second temperature level, wherein the second temperature value is less than the first temperature value.

2. The semiconductor device of claim 1, wherein the temperature sense circuit comprises:
   a first reference voltage generator that is configured to generate a first reference voltage that varies with a first slope responsive to the temperature of the DRAM;
   a second reference voltage generator that is configured to generate a second reference voltage that varies with a second slope responsive to the temperature of the DRAM;
   a comparator that is configured to compare the first reference voltage with the second reference voltage and to generate the temperature signal that is output by the temperature sense circuit based on the comparison; and
   a feedback unit that is configured to vary the second reference voltage generated by the second reference voltage generator based on the temperature signal from the comparator.

3. The semiconductor device of claim 2, wherein the first slope of the first reference voltage and the second slope of the second reference voltage are different from each other.

4. The semiconductor device of claim 1, wherein the first reference voltage generator comprises an asymmetric diode structure.

5. The semiconductor device of claim 4, wherein the second reference voltage generator comprises a plurality of resistors that are configured to generate a combined resistance that varies based on one or more external control signals, and wherein the second reference voltage varies based on the combined resistance of the resistors.

6. The semiconductor device of claim 5, wherein the first reference voltage and the second reference voltage are equal at a specific temperature.

7. The semiconductor device of claim 6, wherein
   the second reference voltage generator further comprises a plurality of switches that each connected across different ones of the plurality of resistors, and are configured to selectively short a corresponding one of the resistors responsive to an associated one of the external control signals and to thereby vary the resistance of the second reference voltage generator; and
   the specific temperature at which the first reference voltage and the second reference voltage are equal is set to a desired sense temperature responsive to the external control signals.

8. The semiconductor device of claim 7, wherein the second reference voltage generator generates the second reference voltage having the same value as the first reference voltage at a first sense temperature when the sensed temperature of the DRAM increases, and generates the second reference voltage having the same value as the first reference voltage at a second sense temperature when the sensed temperature of the DRAM decreases.

9. The semiconductor device of claim 7, wherein when the comparator outputs the temperature signal having the first binary value, the resistance of the second reference voltage generator increases responsive to the first binary value of the temperature signal, and when the comparator outputs the temperature signal having the second binary value, the resistance of the second reference voltage generator decreases responsive to the second binary value of the temperature signal.

10. The semiconductor device of claim 9, wherein when the resistance of the second reference voltage generator increases, the sense temperature decreases, and when the resistance of the second voltage generator decreases, the sense temperature increases.

11. The semiconductor device of claim 9, wherein the resistance of the second reference voltage generator is varied by varying selected ones of the external control signals to selectively open/close corresponding ones of the switches and shorting corresponding ones of the resistors.

12. The semiconductor device of claim 4, wherein the first reference voltage generator comprises a PTAT (proportional to absolute temperature) voltage generator.

13. A semiconductor device comprising a temperature sensor, the temperature sensor comprising:
    a first reference voltage generator that is configured to generate a first reference voltage; and
    a second reference voltage generator that is configured to generate a second reference voltage, wherein the first reference voltage varies with a different slope than the second reference voltage, wherein the second reference voltage has the same value as the first reference voltage at a first sense temperature when a sensed temperature of the semiconductor device is increasing, and the second reference voltage has the same value as the first reference voltage at a second sense temperature when the sensed temperature of the semiconductor device is decreasing, and wherein the first sense temperature is different than the second sense temperature.

14. The semiconductor device of claim 13, wherein the first sense temperature is higher than the second sense temperature.

15. The semiconductor device of claim 13, wherein the first sense temperature is lower than the second sense temperature.

16. The semiconductor device of claim 13, wherein the second reference voltage generator varies the second reference voltage based on a difference between second reference voltage and the first reference voltage.

17. The semiconductor device of claim 13, further comprising a DRAM that is configured to vary its refresh period responsive to the first reference voltage and the second reference voltage.

18. A semiconductor device comprising a temperature sensor, the temperature sensor comprising:

a temperature-dependent voltage generator that is configured to generate a first reference voltage that varies with a first slope responsive to a temperature of the semiconductor device, and to generate a second reference voltage that varies with a second slope responsive to a temperature of the semiconductor device, wherein the first slope is different than the second slope; and a comparator that is configured to compare the first reference voltage and the second reference voltage and to generate a temperature signal based on the comparison, and wherein the temperature-dependent voltage generator is configured to vary the second reference voltage in response to the temperature signal from the comparator.

19. The semiconductor device of claim 18, wherein the temperature-dependent voltage generator comprises an asymmetric diode structure that generate the first reference voltage.

20. The semiconductor device of claim 18, wherein the temperature-dependent voltage generator comprises a plurality of resistors that are configured to generate a combined resistance that varies based on one or more external control signals, and wherein the second reference voltage varies based on the combined resistance of the resistors.

* * * * *